United States Patent
Murayama et al.

(10) Patent No.: US 9,496,434 B2
(45) Date of Patent: Nov. 15, 2016

(54) SOLAR CELL AND METHOD FOR PRODUCING SOLAR CELL

(71) Applicant: MURATA MANUFACTURING CO., LTD., Nagaokakyo-Shi, Kyoto-Fu (JP)

(72) Inventors: Koji Murayama, Nagaokakyo (JP); Masanobu Nomura, Nagaokakyo (JP); Yasushi Iwata, Nagaokakyo (JP); Kanako Tomita, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 185 days.

(21) Appl. No.: 14/187,635

(22) Filed: Feb. 24, 2014

(65) Prior Publication Data
US 2014/0166090 A1    Jun. 19, 2014

Related U.S. Application Data

(63) Continuation of application No. PCT/JP2012/071051, filed on Aug. 21, 2012.

(30) Foreign Application Priority Data

Aug. 24, 2011 (JP) ................... 2011-182292

(51) Int. Cl.
*H01L 31/0224* (2006.01)
*H01L 31/0352* (2006.01)
*H01L 31/06* (2012.01)

(52) U.S. Cl.
CPC ............. *H01L 31/035236* (2013.01); *H01L 31/022425* (2013.01); *H01L 31/035218* (2013.01); *H01L 31/06* (2013.01); *Y02E 10/50* (2013.01)

(58) Field of Classification Search
CPC .................................... H01L 31/035254
See application file for complete search history.

(56) References Cited

U.S. PATENT DOCUMENTS 5,401,336 A     3/1995  Noguchi et al.
5,486,238 A *   1/1996  Nakagawa ........ H01L 31/02242
                                                    136/256

(Continued)

FOREIGN PATENT DOCUMENTS

CN    101933153 A    12/2010
CN    102148266 A     8/2011

(Continued)

OTHER PUBLICATIONS

C. W. Jiang, M. A. Green, "Silicon quantum dot superlattices: Modeling of energy bands, densities of states, and mobilities for silicon tandem solar cell applications", Journal of Applied Physics 99, 114902 (2006).*

(Continued)

*Primary Examiner* — Eric R Smith
(74) *Attorney, Agent, or Firm* — Arent Fox LLP

(57) ABSTRACT

A solar cell that includes a negative electrode made of Al—Nd or the like formed on a substrate, an electron transport layer made of n-type Si or the like, a quantum dot arrangement layer made of graphene or the like, a quantum dot layer, a positive hole transport layer made of p-type Si or the like, and a positive electrode made of ITO or the like are sequentially formed on a surface of the negative electrode. Output electrodes are formed on the positive electrode so that at least a part of the surface of the positive electrode is exposed. The quantum dot layer is constructed such that quantum dots of Si cluster particles are three-dimensionally periodically arranged. The Si cluster particles have an average particle size of 3 nm or less, and the interparticle distance between the Si cluster particles is 1 nm or less.

11 Claims, 7 Drawing Sheets

(56) References Cited

U.S. PATENT DOCUMENTS

| | | |
|---|---|---|
| 2008/0179762 A1 | 7/2008 | Cho et al. |
| 2008/0230782 A1* | 9/2008 | Antoniadis ......... H01L 31/0352 257/53 |
| 2009/0095349 A1 | 4/2009 | Forrest et al. |
| 2009/0114848 A1 | 5/2009 | Iwata et al. |
| 2010/0154874 A1 | 6/2010 | Hirose et al. |
| 2010/0297391 A1* | 11/2010 | Kley ..................... C23C 16/01 428/141 |
| 2011/0203650 A1* | 8/2011 | Furusawa ............. B82Y 20/00 136/255 |
| 2011/0290310 A1* | 12/2011 | Kuramachi ........... B82Y 20/00 136/255 |
| 2013/0000727 A1* | 1/2013 | Iwata ..................... H01L 31/06 136/261 |

FOREIGN PATENT DOCUMENTS

| | | | |
|---|---|---|---|
| JP | 5-160420 | 6/1993 | |
| JP | 7-131041 | 5/1995 | |
| JP | 2004-356163 A | 12/2004 | |
| JP | 2005-322877 A | 11/2005 | |
| JP | 2006-100785 A | 4/2006 | |
| JP | 2007-162059 A | 6/2007 | |
| JP | 2008-182247 A | 8/2008 | |
| JP | 2010-103510 A | 5/2010 | |
| JP | 2010-129579 A | 6/2010 | |
| JP | WO 2011105102 A1 * | 9/2011 | ............. H01L 31/06 |
| KR | WO 2011090300 A2 * | 7/2011 | ........... H01L 27/302 |
| WO | WO 03/026017 A1 | 3/2003 | |
| WO | WO 2008/062660 A1 | 5/2008 | |
| WO | WO-2011-105102 A1 | 9/2011 | |

OTHER PUBLICATIONS

Machine translation of WO2011/090300A2.*
Japanese Office Action dated Jun. 1, 2015 issued for JP2013-530020 with English translation.
Arguirov et al., "Residual Stress in Si Nanocrystals embedded in a Sio2 Matrix" Applied Physics Letters 89, 05311 (2006).
Conibeer et al., "Silicon Quantum Dot Nanostructures for Tandem Photovoltaic Cells" Thin Solid Films 516 (2008) 6748-6756.
PCT/JP2012/071051 ISR dated Sep. 10, 2012.

* cited by examiner

SOLAR CELL AND METHOD FOR PRODUCING SOLAR CELL

CROSS REFERENCE TO RELATED APPLICATIONS

The present application is a continuation of International application No. PCT/JP2012/071051, filed Aug. 21, 2012, which claims priority to Japanese Patent Application No. 2011-182292, filed Aug. 24, 2011, the entire contents of each of which are incorporated herein by reference.

FIELD OF THE INVENTION

The present invention relates to a solar cell and a method for producing the solar cell, and more particularly to a solar cell that converts light energy into electric energy by absorbing solar light with a quantum dot layer formed of an assembly of quantum dots as well as a method for producing the same.

BACKGROUND OF THE INVENTION

In accordance with an enhanced interest in natural renewable energy, a solar cell using solar light power generation is attracting people's attention. In particular, development of a Si-based solar cell using a silicon (hereafter referred to as "Si") based material that is abundant in the amount of resources and capable of saving the resources and reducing the costs is eagerly carried out.

In this type of Si-based solar cell, a p-type semiconductor formed of a p-type Si-based material and an n-type semiconductor formed of an n-type Si-based material are joined to form a p-n junction. Further, when a depletion layer formed at the interface of the p-n junction is irradiated with solar light, the carriers are excited to generate photoelectric current, and this is subjected to photoelectric conversion to be output to the outside.

However, regarding such a Si-based solar cell of p-n junction type, the energy conversion efficiency is theoretically as low as about 30% at the maximum and, for this reason, it is demanded that a solar cell having a larger energy conversion efficiency at a low cost is realized.

Thus, a Si quantum dot solar cell in which a Si quantum dot layer is interposed between the aforesaid p-type semiconductor and the aforesaid n-type semiconductor is recently attracting people's attention.

This Si quantum dot solar cell aims at effectively utilizing the solar light spectrum by applying a quantum dynamics theory to nanotechnology, and this enables a large improvement in the conversion efficiency, so that the Si quantum dot solar cell is regarded as being prospective as a next-generation solar cell.

With regard to this type of Si quantum dot solar cell, a method disclosed in non-patent document 1, for example, is known as a method for fabricating a quantum dot structure.

This non-patent document 1 provides reports on a residual stress of Si nanocrystals dispersed in a $SiO_2$ matrix, where an amorphous silicon (a-Si) layer and a silicon dioxide ($SiO_2$) layer are alternately stacked and thermally treated at a temperature of about 1100° C. This allows that Si quantum dots are obtained in a mode in which Si of the a-Si layer is deposited and dispersed in the $SiO_2$ matrix.

Also, non-patent document 2 provides reports on a Si quantum dot nanostructure for a tandem-type photovoltaic cell.

In this non-patent document 2, a $SiO_2$ layer and a Si-rich oxide (SRO) layer are alternately stacked and thermally treated at a temperature of 1050° C. to 1150° C. in a nitrogen atmosphere. This allows that, in the same manner as in non-patent document 1, Si quantum dots are obtained in a mode in which Si in the SRO layer is deposited and dispersed in the $SiO_2$ matrix.

Also, this non-patent document 2 reports that a silicon nitride ($Si_3Ni_4$) layer or a silicon carbide (SiC) layer can be used instead of the $SiO_2$ layer.

Non-patent Document 1: T. Arguirov et al., "Residual stress in Si nanocrystals embedded in a SiO2 matrix", Applied Physics Letters, 89, 053111 (2006) pp. 6748-6756

Non-patent Document 2: G. Conibeer et. al., "Silicon quantum dot nanostructures for tandem photovoltaic cells", Thin Solid Films, 516 (2008) pp. 6748-6756

SUMMARY OF THE INVENTION

In the meantime, in order that a Si quantum dot solar cell realizes a high energy conversion efficiency, it is necessary that the excitons generated in the quantum dots are efficiently separated into carriers, and the solar cell has a good carrier transport property. For this purpose, it is preferable that the average particle size of the quantum dots is minutely small and that the interparticle distance between the quantum dots is as small as possible.

However, according to the methods of non-patent document 1 and non-patent document 2, the a-Si layer or the SRO layer and the $SiO_2$ layer are alternately stacked and thermally treated to let Si particles deposited, thereby to form quantum dots. For this reason, it is difficult to control the interparticle distance uniformly, so that, for example, there are cases in which the Si quantum dots are scattered by being spaced apart from each other with a distance of 5 nm or more. Also, it is difficult to control the particle size of the Si quantum dots, and there is a fear that Si quantum dots having a large particle size may be mingled. For this reason, in a current situation, it is not yet possible to obtain a desired high energy conversion efficiency making use of the characteristics of the Si quantum dots.

Moreover, in non-patent document 1 and non-patent document 2, the a-Si layer or the SRO layer and the $SiO_2$ layer are alternately stacked and thereafter thermally treated at a high temperature. This raises a problem in that, in the case of stacking a large number of Si quantum dots that are in a single layer form, increase in the number of steps is invited, thereby providing a poor productivity.

The present invention has been made in view of the aforementioned circumstances, and an object thereof is to provide a highly efficient solar cell having a good absorption coefficient, being excellent in carrier transport property, and having a good energy conversion efficiency, as well as a method for producing the solar cell.

The present inventors have made eager researches by paying attention to silicon clusters (hereafter referred to as "Si clusters") as a quantum dot structure and have found out that, when the Si cluster particles are miniaturized to have an average particle size of 3 nm or less, the Si cluster particles will have a core-shell structure that is made of a core part having a regular tetrahedron diamond structure similar to that of Si nanocrystals and a shell part in a surface layer having a cage structure. Further, the present inventors have obtained a knowledge that, with these miniaturized Si cluster particles, a high absorption coefficient can be obtained by the diamond structure of the core part, while the miniaturized Si cluster particles are made inactive to chemical reactions by the cage structure of the shell part, thereby improving the carrier transport property and the carrier lifetime.

Also, it has been found out that, by three-dimensionally periodically arranging these miniaturized Si cluster particles at an interval with an interparticle distance of 1 nm or less, the carrier transport property among the Si cluster particles is improved.

Further, it has been found out that, by introduction of a quantum structure, an intermediate band (energy level) can be formed and, by means of light absorption through the intermediary of such an intermediate band, a large improvement in the absorption coefficient can be made, whereby a highly efficient solar cell can be obtained.

In the meantime, with respect to the stack structure of solar cells, there may be conceived a first structure in which an output electrode and a positive electrode are formed on a substrate surface and solar light is radiated from a negative electrode side and a second structure in which a negative electrode is formed on a substrate surface and solar light is radiated from a positive electrode side.

Further, with a view to allowing an interface of the negative electrode and the electron transport layer to have an ohmic contact, it is desired to perform a thermal treatment at a high temperature of about 500° C. as film-forming conditions, so as to join the two. Also, since the electron transport layer is designed to have a comparatively large film thickness, it is preferable to form the film at a high temperature in order to obtain a good film quality with restrained generation of surface defects.

However, in the case of the first structure, the positive electrode is formed on the substrate surface and thereafter the positive hole transport layer, the quantum dot layer, the electron transport layer, and the negative electrode are sequentially formed, so that the formation of the electron transport layer and the negative electrode is carried out after the formation of the quantum dot layer. Further, in the case of forming the films of the electron transport layer and the negative electrode after the formation of the quantum dot layer, the film-forming or the thermal treatment must be carried out at a high temperature in order to ensure an ohmic contact and a good film quality. For this reason, the quantum dot layer is exposed to a high-temperature atmosphere, thereby raising a fear of inviting deterioration of the characteristics by denaturing of the quantum dot layer.

In contrast, in the case of the second structure, the negative electrode is formed on the substrate surface and thereafter the electron transport layer, the quantum dot layer, the positive hole transport layer, and the positive electrode are sequentially formed, so that the formation of the electron transport layer and the negative electrode is carried out before the formation of the quantum dot layer. This allows that the quantum dot layer is not affected by the film-forming conditions, and denaturing of the quantum dot layer can be evaded.

Therefore, as a stack structure of solar cells, the aforementioned second structure is preferably adopted.

The present invention has been made on the basis of such a knowledge, and the solar cell according to the present invention is a solar cell in which a quantum dot layer made of an assembly of quantum dots is interposed between an electron transport layer and a positive hole transport layer, the quantum dot layer absorbing solar light, wherein a negative electrode is formed on a substrate; the electron transport layer, the quantum dot layer, the positive hole transport layer, and a positive electrode made of a light-transmitting material are sequentially formed on a principal surface of the negative electrode; and an output electrode is formed on the positive electrode so that at least a part of a surface of the positive electrode is exposed; the quantum dot layer is constructed in such a manner that the quantum dots are formed of Si cluster particles, and the Si cluster particles are three-dimensionally periodically arranged; the Si cluster particles have an average particle size of 3 nm or less; and an interparticle distance between the Si cluster particles is 1 nm or less.

Also, in the solar cell of the present invention, it is preferable that the substrate is formed of a material selected from the group consisting of quartz glass, nonalkaline glass, borosilicate glass, alumina, gallium arsenic, Si, and silicon carbide.

Further, in the solar cell of the present invention, it is preferable that the electron transport layer is formed of an n-type Si-based material.

Also, in the case of the second structure described above, the electron transport layer has little deterioration of characteristics by defects, so that a single-crystal or polycrystal n-type Si-based substrate can be used as a material for the electron transport layer.

In other words, the solar cell according to the present invention is a solar cell in which a quantum dot layer made of an assembly of quantum dots is interposed between an electron transport layer and a positive hole transport layer, the quantum dot layer absorbing solar light, wherein the electron transport layer is formed of a single-crystal or polycrystal n-type Si-based substrate; the quantum dot layer, the positive hole transport layer, and a positive electrode made of a light-transmitting material are sequentially formed on one principal surface of the electron transport layer; an output electrode is formed on the positive electrode so that at least a part of a surface of the positive electrode is exposed; and a negative electrode is formed on the other surface of the electron transport layer; the quantum dot layer is constructed in such a manner that the quantum dots are formed of Si cluster particles, and the Si cluster particles are three-dimensionally periodically arranged; the Si cluster particles have an average particle size of 3 nm or less; and an interparticle distance between the Si cluster particles is 1 nm or less.

Also, in the solar cell described above, from the viewpoint of preventing recombination of carriers at the junction interface between the n-type Si-based substrate constituting the electron transport layer and the negative electrode, it is preferable to interpose an insulating film between the n-type Si-based substrate and the negative electrode while enabling electric conduction of the two.

In other words, in the solar cell of the present invention, it is preferable that an insulating film having a predetermined pattern is formed on the other principal surface of the electron transport layer, and the negative electrode is formed on the other principal surface side via the insulating film so that a part of the negative electrode is joined to the electron transport layer.

This makes it possible to suppress recombination of carriers at the junction interface between the n-type Si-based substrate constituting the electron transport layer and the negative electrode.

Also, in the solar cell of the present invention, it is preferable that the quantum dot layer comprises a multiple energy level structure having an intermediate energy level between a valence electron band and a conduction band.

This allows an effective absorption of light.

Also, by providing a quantum dot arrangement layer between the electron transport layer and the quantum dot layer with use of a graphene-based material or the like, the Si cluster particles can be periodically arranged at a high precision on the quantum dot arrangement layer.

In other words, in the solar cell of the present invention, it is preferable that a quantum dot arrangement layer is formed between the electron transport layer and the quantum dot layer.

This can realize a highly precise periodical arrangement of the Si cluster particles on the quantum dot arrangement layer.

Also, in the solar cell of the present invention, it is preferable that the quantum dot arrangement layer is formed of a graphene-based material.

Also, in the solar cell of the present invention, it is preferable that the positive hole transport layer is formed of a p-type Si-based material.

Also, in the solar cell of the present invention, it is preferable that the negative electrode contains Al as a major component and further contains at least one kind of an impurity selected from Nd, Ta, and Cu, and a content of the impurity is 0.01 to 3 at %.

This can form a negative electrode having a good flatness.

Also, in the solar cell of the present invention, it is preferable that the positive electrode is formed of one of an oxide transparent electroconductive film, graphene, and a transparent electroconductive film made of a nanowire network texture.

Also, the method for producing a solar cell according to the present invention is a method for producing a solar cell in which a quantum dot layer made of an assembly of quantum dots is interposed between an electron transport layer and a positive hole transport layer, the quantum dot layer absorbing solar light, wherein a negative electrode is formed on a substrate surface and thereafter the electron transport layer is formed on a surface of the negative electrode; subsequently Si cluster particles having an average particle size of 3 nm or less are three-dimensionally periodically arranged on a principal surface of the electron transport layer so that an interparticle distance thereof is 1 nm or less, so as to form the quantum dot layer; thereafter the positive hole transport layer is formed on a surface of the quantum dot layer; subsequently a positive electrode made of a light-transmitting material is formed on a surface of the positive hole transport layer; and further an output electrode is formed on the positive electrode so that at least a part of a surface of the positive electrode is exposed.

Also, in the method for producing a solar cell of the present invention, it is preferable that the electron transport layer is formed of an n-type Si-based material.

Also, the method for producing a solar cell according to the present invention is a method for producing a solar cell in which a quantum dot layer made of an assembly of quantum dots is interposed between an electron transport layer and a positive hole transport layer, the quantum dot layer absorbing solar light, wherein a single-crystal or polycrystal n-type Si-based substrate is used as the electron transport layer; Si cluster particles having an average particle size of 3 nm or less are three-dimensionally periodically arranged on one principal surface of the electron transport layer so that an interparticle distance thereof is 1 nm or less, so as to form the quantum dot layer; subsequently the positive hole transport layer is formed on a surface of the quantum dot layer; thereafter a positive electrode made of a light-transmitting material is formed on a surface of the positive hole transport layer; further an output electrode is formed on the positive electrode so that at least a part of a surface of the positive electrode is exposed; and meanwhile a negative electrode is formed on the other principal surface of the electron transport layer so as to join the electron transport layer and the negative electrode with each other.

Also, in the method for producing a solar cell of the present invention, it is preferable that an insulating film having a predetermined pattern is formed on the other principal surface of the electron transport layer, and the negative electrode is formed on a surface of the insulating film so that a part of the negative electrode is joined to the electron transport layer.

This allows that a highly efficient solar cell can be produced in which recombination of carriers at the interface between the electron transport layer and the negative electrode is suppressed as much as possible.

Also, in the method for producing a solar cell of the present invention, it is preferable that a quantum dot arrangement layer is formed on a surface of the electron transport layer, and the quantum dot layer is formed on a surface of the quantum dot arrangement layer.

This allows that, because the quantum dot arrangement layer is formed on the electron transport layer which is flat, the quantum dot arrangement layer has a uniform film quality, so that a quantum dot layer having Si cluster particles being in a better three-dimensional order and periodically arranged at a desired high precision can be obtained.

Also, in the method for producing a solar cell of the present invention, it is preferable that the quantum dot arrangement layer is formed of a graphene-based material.

Also, in the method for producing a solar cell of the present invention, it is preferable that a series of treatments after forming the quantum dot layer are carried out at a treatment temperature of 200° C. or lower.

This enables fabrication of a solar cell without inviting deterioration of the characteristics of the quantum dot layer or the like.

Also, in the method for producing a solar cell of the present invention, it is preferable that the positive hole transport layer is formed of a p-type Si-based material.

According to the solar cell of the present invention, a negative electrode is formed on a substrate such as quartz glass; an electron transport layer made of an n-type Si-based material, a quantum dot layer, a positive hole transport layer made of a p-type Si-based material, and a positive electrode made of a light-transmitting material made of an oxide transparent electroconductive film, graphene, or a transparent electroconductive film made of a nanowire network texture are sequentially formed on a principal surface of the negative electrode; an output electrode is formed on the positive electrode so that at least a part of the surface of the positive electrode is exposed; the quantum dot layer is constructed in such a manner that the quantum dots are formed of Si cluster particles; the Si cluster particles are three-dimensionally periodically arranged; the Si cluster particles have an average particle size of 3 nm or less; and an interparticle distance between the Si cluster particles is 1 nm or less. Therefore, the Si cluster particles have a core-shell structure made of a diamond structure and a cage structure, whereby a highly efficient solar cell having a high absorption coefficient, being inactive to chemical reactions, having a good carrier transport property, enabling extension of the lifetime of the carriers, and providing a good energy conversion efficiency can be realized.

Moreover, since the stack structure is a substrate/a negative electrode/an electron transport layer/a quantum dot layer/a positive hole transport layer/a positive electrode/an output electrode as described above, the quantum dot layer is not affected even when film-forming or thermal treatment is carried out at a high temperature in forming the negative electrode or the electron transport layer, so that an electron transport layer having a good film quality with few defects can be obtained. Further, an ohmic contact can be ensured at the interface between the electron transport layer and the negative electrode, so that a solar cell having a higher efficiency can be realized.

Also, the electron transport layer undergoes little deterioration of characteristics by defects, so that a single-crystal or polycrystal n-type Si-based substrate can be used as a material for the electron transport layer.

Also, according to the method for producing a solar cell of the present invention, a negative electrode is formed on a substrate surface and thereafter an electron transport layer made of an n-type Si-based material or the like is formed on a surface of the negative electrode; subsequently Si cluster particles having an average particle size of 3 nm or less are three-dimensionally periodically arranged on a principal surface of the electron transport layer so that an interparticle distance thereof is 1 nm or less, so as to form the quantum dot layer; thereafter a positive hole transport layer made of a p-type Si-based material or the like is formed on a surface of the quantum dot layer; subsequently a positive electrode made of a light-transmitting material is formed on a surface of the positive hole transport layer; and further an output electrode is formed on the positive electrode so that at least a part of a surface of the positive electrode is exposed. Therefore, a solar cell can be produced under desired film-forming conditions without giving consideration to the influence on the quantum dot layer, and also the substrate need not have a light-transmitting property, so that the selectivity of the substrate is also improved.

Moreover, since the quantum dot layer is formed through one film-forming process so that the quantum dots are three-dimensionally periodically arranged, the production steps in the case of stacking the Si quantum dots are simplified as compared with the prior art, thereby achieving an improvement in the productivity.

Also, even in a case in which a single-crystal or polycrystal n-type Si-based substrate is used in place of an n-type Si-based material, a solar cell can be produced under desired film-forming conditions without giving consideration to the influence on the quantum dot layer, in the same manner as described above. Moreover, in this case, the substrate typically provided in the lowermost layer can be omitted.

DETAILED DESCRIPTION OF THE INVENTION

Hereafter, embodiments of the present invention will be described in detail with reference to the drawings.

Figure 1:
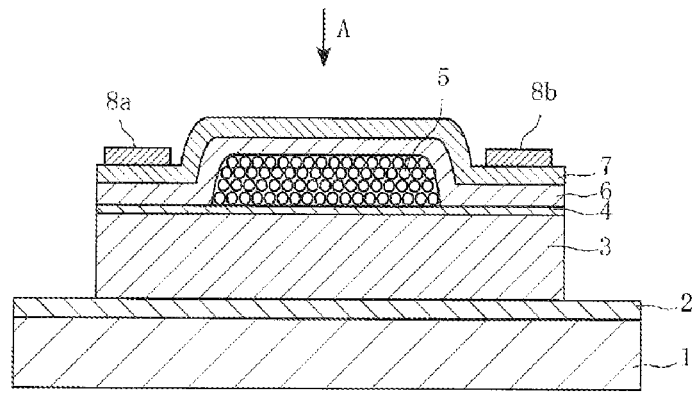
FIG. 1 is a cross-sectional view illustrating one embodiment (first embodiment) of a solar cell according to the present invention.

FIG. 1 is a cross-sectional view illustrating one embodiment (first embodiment) of a solar cell according to the present invention.

In this solar cell, a negative electrode 2 is formed on a surface of substrate 1, and an electron transport layer 3 is formed on a surface of negative electrode 2. Also, a quantum dot arrangement layer 4 is formed on a surface of electron transport layer 3, and a quantum dot layer 5 made of an assembly of Si cluster particles (quantum dots) is formed in a center region on a surface of the quantum dot arrangement layer 4. Further, a positive hole transport layer 6 is formed in a mode of covering the quantum dot layer 5. Further, a positive electrode 7 made of a light-transmitting material is formed on a surface of the positive hole transport layer 6. Also, a pair of output electrodes 8a, 8b are formed in a neighborhood of both ends of the positive electrode 7.

When the solar cell formed in this manner is irradiated with solar light in a direction shown by arrow A, carriers are generated in the quantum dots of the quantum dot layer 5, and the carriers (positive holes and electrons) are drawn out to the outside of the quantum dots by exciton absorption. Further, the positive holes among the carriers are transported to the positive electrode 7 via the positive hole transport layer 6, so as to be conducted to the output electrodes 8a, 8b. On the other hand, the electrons are transported to the negative electrode 2 via the electron transport layer 3, whereby photoelectromotive force is generated.

Here, the substrate material used in the substrate 1 is not particularly limited. In other words, since the solar light is allowed to be incident from the positive electrode 7 side shown by arrow A which is on the side opposite to the substrate 1, a light-transmitting property is not demanded, so that, for example, a material selected from the group consisting of quartz glass, nonalkaline glass, borosilicate glass, alumina, gallium arsenic, Si, and silicon carbide can be used.

Also, the negative electrode material used in the negative electrode 2 is not particularly limited; however, an Al-based material is typically used. Also, since it is desired that the negative electrode 2 is in ohmic contact with the electron transport layer 3, it is preferable to perform film-forming or thermal treatment of the negative electrode 2 at a high temperature of 500° C. or more. Further, in order to ensure flatness of the negative electrode 2 even when a thermal treatment at such a high temperature is carried out, it is preferable to use a negative electrode material that contains Al as a major component and contains about 0.01 to 3 at % of an impurity such as Nd, Ta, or Cu.

Also, the electron transport layer material used in the electron transport layer 3 is not particularly limited. Typically, however, an n-type Si-based material which is excellent in electron transport property, abundant in the amount of resources, and inexpensive, particularly an amorphous or fine-crystal n-type Si-based material, for example, n-type Si, n-type SiC, n-type SiGe, or the like can be preferably used. Here, the electron transport layer 3 contains a donor as an impurity, and the concentration of such a donor is preferably about $1.0 \times 10^{15}$ to $1.0 \times 10^{19}$ cm$^{-3}$.

Also, the positive hole transport layer material used in the positive hole transport layer 6 is not particularly limited. Typically, however, a p-type Si-based material which is excellent in positive hole transport property, abundant in the amount of resources, and inexpensive, particularly an amorphous or fine-crystal p-type Si-based material, for example, p-type Si, p-type SiC, or the like can be preferably used. Here, the positive hole transport layer 6 contains an acceptor as an impurity, and the concentration of such an acceptor is preferably about $1.0 \times 10^{19}$ cm$^{-3}$.

Also, the positive electrode material used in the positive electrode 7 is not particularly limited as long as the material has a light-transmitting property, so that an oxide transparent electroconductive film such as ITO (In$_2$O$_3$·SnO$_2$), AZO (ZnO·Al$_2$O$_3$), GZO (ZnO·Ga$_2$O$_3$), IZO (In$_2$O$_3$·ZnO), or IGZO (InGaZnO), and further, graphene or a transparent electroconductive film made of a nanowire network texture such as Ag or CNT (carbon nanotube) can be used. In this case, the oxide transparent electroconductive film can be formed by the sputtering method, the vacuum vapor deposition method, or the like, and the graphene film can be formed by the CVD method or the like, and both can be formed through a dry process. Also, in the case of Ag or CNT, the film can be formed through a wet process by preparing a dispersion solution and applying the dispersion solution, followed by drying.

Here, the electrode material used in the output electrodes 8a, 8b is not particularly limited, so that, for example, an Ag-based material being comparatively inexpensive, having an oxidation resistance property, and having a good electric conduction property is preferably used.

Further, the quantum dot layer 5 is formed of an assembly of miniaturized Si cluster particles.

When the Si cluster particles are miniaturized, they will have what is known as a core-shell structure in which the crystal structure of atomic arrangement is different between the surface layer and the inside.

The core part has a regular tetrahedron diamond structure. In the core part, the quantum confinement effect is promoted by miniaturizing the Si cluster particles, so that an outstanding improvement in the light absorption coefficient can be made. On the other hand, in the diamond structure, the atomic orbital in the atomic valence state forms an sp$^3$ hybrid orbital, where the σ electrons are dominant, and has an unpaired electron.

In other words, since the core part has a diamond structure, forms an sp$^3$ hybrid orbital, and has an unpaired electron, the carriers are captured by this unpaired electron on the crystal surface, and the lifetime of the carriers becomes extremely short due to the capture of the carriers by the unpaired electron. Here, in a conventional Si-based solar cell using a Si nanocrystal, the aforesaid Si nanocrystal is formed only of a diamond structure, so that it seems to be difficult to extend the lifetime of the carriers due to the above-described reason.

In contrast, the shell part has a cage structure, where the π electrons intervene, and the atomic orbital in the atomic valence state forms an sp$^2$ hybrid orbital.

In other words, in the shell part, the atomic orbital in the atomic valence state forms an sp$^2$ hybrid orbital, so that there are no unpaired electrons; the carriers are not captured; the carrier transport property is improved; the solar cell is inactive to chemical reactions; and the lifetime of the carriers can be extended.

Further, in order that the Si cluster particles form such a core-shell structure, it is necessary that the Si cluster particles are miniaturized to have an average particle size of 3 nm or less, preferably 2.5 nm or less. In other words, when the average particle size of the Si cluster particles exceeds 3 nm, the diamond structure will be dominant in the crystal structure, making it difficult to form a desired cage structure. Here, though the lower limit of the average particle size of the Si cluster particles is not particularly limited, the lower limit is preferably 1 nm or more, more preferably 2 nm or more, in order that the core part assumes a diamond structure instead of an amorphous structure. Also, in order to obtain a further better carrier transport property, the particle size distribution of the Si cluster particles is preferably as narrow as possible, so that the particle size dispersion is preferably within 5% to 10%.

Also, in order to improve the carrier transport property, it is important to make the interparticle distance between the Si cluster particles be as short as possible. In other words, in the sp$^2$ hybrid orbital in the cage structure of the Si cluster particles, the wave function extends also in the radial direction of the Si cluster particles. Further, by stacking the Si cluster particles at a high density, such wave functions slightly overlap with each other, so that the carriers move directly between the Si cluster particles by extension of the wavenumber of electrons in the shell part, whereby the carrier transport property can be improved. Further, for this purpose, it is necessary to make the interparticle distance between the Si cluster particles be 1 nm or less. However, it is not preferable to make the interparticle distance be equal to or smaller than the distance (=0.25 nm) between the Si atoms of the sp$^2$ hybrid orbital in the cage structure.

Further, in the present embodiment, the Si cluster particles miniaturized to have an average particle size of 3 nm or less are three-dimensionally periodically arranged on the quantum dot arrangement layer 4, so as to form the quantum dot layer 5 having a three-dimensional order. Further, by this, the quantum dot layer 5 has a multiple energy structure having an intermediate energy level between a valence electron band and a conduction band, whereby the accumulation property of the carriers is improved to achieve an improvement in the energy conversion efficiency.

Figure 2A:
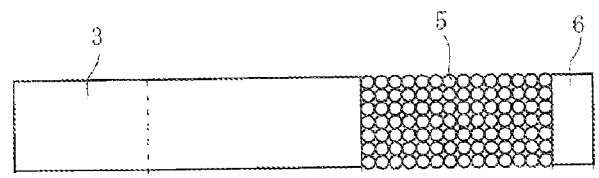
FIGS. 2(a) and 2(b) are views illustrating a band structure of an electron transport layer/a quantum dot layer/a positive hole transport layer.
Figure 2B:
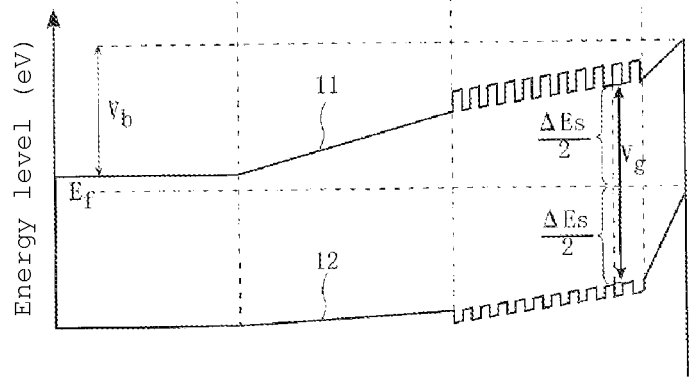

FIGS. 2(a) and 2(b) are views showing an energy band structure of an electron transport layer/a quantum dot layer/a positive hole transport layer.

FIG. 2(a) shows a state in which the quantum dot layer 5 made of an assembly of Si cluster particles is interposed between the electron transport layer 3 and the positive hole transport layer 6. Here, in FIGS. 2(a) and 2(b), illustration of the quantum dot arrangement layer 4 is omitted for the sake of description.

FIG. 2(b) shows an energy structure corresponding to FIG. 2(a).

The quantum dot layer 5 exists in depletion layer W formed by joining the electron transport layer 3 and the positive hole transport layer 6 with each other, and the electrons from the electron transport layer 3 and the positive holes from the positive hole transport layer 6 are transported to the quantum dot layer 5. Further, in the quantum dot layer 5, the positive holes and the electrons are in equilibrium, so that the space charge is zero, and the Fermi level $E_f$ is located at the center of the band gap $V_g$ which is a difference between the energy level of a conduction band 11 and the energy level of a valence electron band 12 ($V_g = \Delta E_g/2$).

Further, in the thermal equilibrium state, there is no movement of the carriers, and the Fermi levels of the electron transport layer 3, the quantum dot layer 5, and the positive hole transport layer 6 coincide with each other. A built-in potential $V_b$ is generated in depletion layer W by the potential difference between the negative potential of the positive hole transport layer 6 and the positive potential of the electron transport layer 3 with an electrically neutral quantum dot layer 5 intervening therebetween.

In this manner, because the Fermi level $E_f$ of the quantum dot layer 5 is located at the center of the band gap Vg, the built-in potential $V_b$ can be increased, whereby a solar cell having a large open-circuit voltage can be obtained.

Also, in the present embodiment, the Si cluster particles are three-dimensionally periodically arranged, so that the allowable energy levels of electrons are discrete to form an intermediate energy level. Relative to the absorption end of Si defined by the band gap Vg, the absorption end defined by the energy level of the valence electron band or the conduction band and the intermediate energy level has a further longer wavelength, so that the quantum efficiency in a long-wavelength region can be raised.

Also, the number of stacked layers of the Si cluster particles periodically arranged in the quantum dot layer 5 is preferably about 100 to 300 layers. When the aforesaid number of stacked layers is less than 100 layers, a sufficient absorption ratio of solar light spectrum cannot be obtained, making it difficult to provide a higher efficiency. On the other hand, when the number of stacked layers exceeds 300 layers, the built-in potential $V_b$ applied as a load in the quantum dot layer 5 becomes small, thereby raising a fear that efficient transportation of the generated carriers cannot be made.

Here, the Si cluster particles are preferably formed of an intrinsic Si semiconductor material that does not contain an impurity or a highly pure Si semiconductor material in which, even when an impurity is contained, the content thereof is slight.

Also, in the present embodiment, in view of providing a better three-dimensional order and further improving the carrier lifetime in periodically arranging quantum dots in the quantum dot layer 5, the quantum dot arrangement layer 4 having an extremely small film thickness is provided between the electron transport layer 3 and the quantum dot layer 5. This quantum dot arrangement layer 4 is preferably formed by using a graphene-based material such as graphene or graphene oxide.

Hereafter, a case in which graphene is used in the quantum dot arrangement layer 4 will be described in detail.

Graphene is a thin film artificially produced by isolating one layer to several layers of atomic layers from graphite. The electrons in graphene behave as relativistic particles and contribute to an improvement in the carrier transport property without depending on temperature.

In other words, in graphene, the electrons form continuous energy bands with no band gap in the neighborhood of the C atomic nucleus and freely move in the solid. Further, according as it goes away from the C atomic nucleus, the energy bands of electrons become gradually discrete; however, since the energy discreteness width and the distance from the atomic nucleus are linear, the electrons move in the solid in a state of being close to the speed of light, and the mass of the electrons approaches zero.

When Si cluster particles are formed as quantum dots on the surface of graphene serving as the quantum dot arrangement layer 4, the wave functions of electrons overlap with each other between the $\pi$ electrons of graphene surface and the $\pi$ electrons of the shell part of the Si cluster particles, and the electrons in the graphene are transported to the Si cluster particles. Further, when the Si cluster particles are adsorbed onto the surface of graphene, the electrons in the graphene are transported into the Si cluster particles in a local region of graphene that is in contact with the Si cluster particles, thereby forming a quantum confinement state. Here, the Si atoms in the Si cluster particles are adsorbed onto the C atomic nucleus of graphene.

Figure 3A:
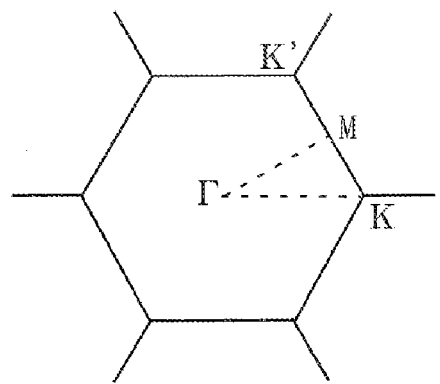
FIGS. 3(a) and 3(b) are views showing a graphene hexagonal lattice and an energy dispersion relationship.
Figure 3B:
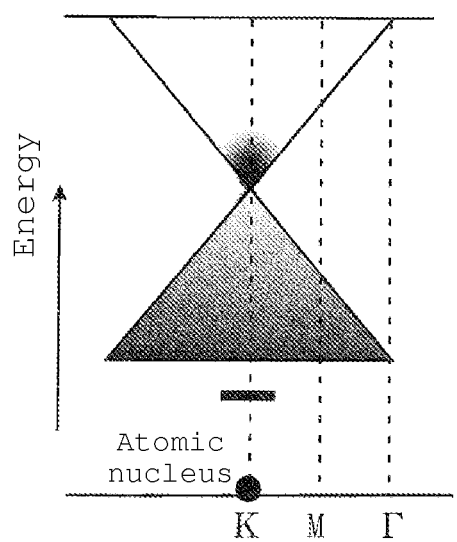

FIG. 3(*a*) shows an inverse lattice of a graphene crystal structure, and FIG. 3(*b*) shows a dispersion relationship between the energy and the wave number of electrons corresponding to the aforesaid inverse lattice.

In graphene, there are a Γ point of the wave number space, a K point and a K' point at the corners of the hexagonal lattice, and an M point at the center of the K point and the K' point as points having a high symmetricity. When Si cluster particles are vapor-deposited after graphene is stacked onto the electron transport layer 3, the Si cluster particles fly to come with a high energy and move on the graphene surface. Then, the Si atoms of the Si cluster particles are adsorbed onto the K point and the K' point of the graphene surface and stably adhere onto the graphene.

In this manner, the Si cluster particles are periodically arranged at a high precision, whereby a first layer of the Si cluster particles is formed on the graphene surface. Thereafter, the Si cluster particles of the second layer and subsequent layers are periodically arranged at a high precision in a similar manner along the periodical arrangement of the aforesaid first layer of the Si cluster particles.

In the Si cluster particles periodically arranged at a high precision in this manner, a stable intermediate energy level is formed, whereby a solar cell having a high efficiency can be realized. Further, the carriers generated in the quantum dot layer 5 are transported to the electron transport layer 3 without being annihilated by the graphene (quantum dot arrangement layer 4). In other words, after the carriers generated in the inside of the quantum dot layer 5 reach the shell part, the wave function of the carriers overlaps with that of the graphene (quantum dot arrangement layer 4) that intervenes at the interface with the electron transport layer 3, and the carriers are transported to the electron transport layer 3 via the graphene.

In this manner, the graphene surface has an extremely good carrier transportation property, whereby the carriers are efficiently transported to the electron transport layer 3. Moreover, since the lifetime of the carriers generated in the quantum dot layer 5 is extended, a solar cell having a high energy conversion efficiency can be fabricated.

Next, the reason why the stack structure of the solar cell is set to be as shown in FIG. 1 will be described in detail.

Figure 4:
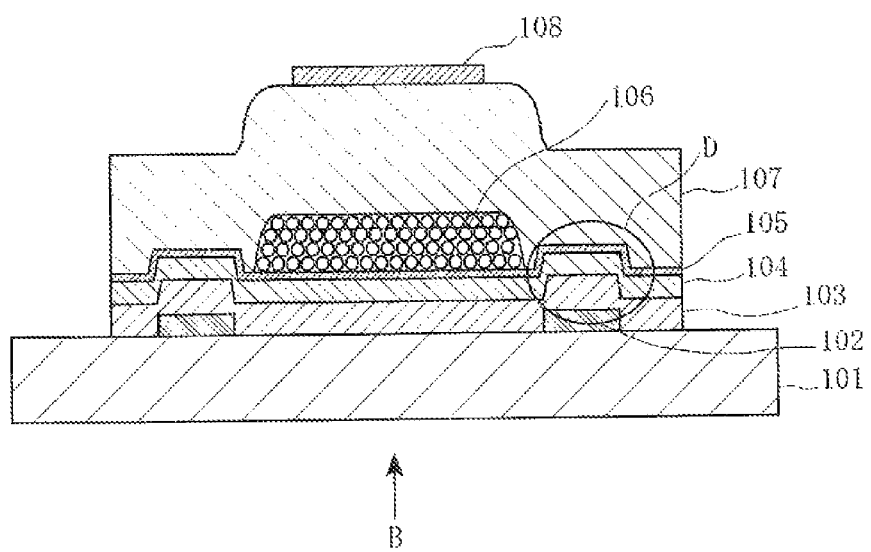
FIG. 4 is a cross-sectional view of a solar cell of a Comparative Example.

In the case of a solar cell such as in the present invention, the following procedure is conventionally taken. Typically, referring to FIG. 4, after a pair of output electrodes 102 are formed on a surface of a transparent substrate 101, a positive electrode 103 made of a light-transmitting material is formed; a positive hole transport layer 104, a quantum dot arrangement layer 105, a quantum dot layer 106, an electron transport layer 107, and a negative electrode 108 are sequentially formed on a positive electrode 103; and solar light is radiated from the transparent substrate 101 side in the direction shown by arrow B.

When such a stack structure is applied to the present invention, the electron transport layer 107 and the negative electrode 108 are formed after the quantum dot layer 106 made of an assembly of Si cluster particles is formed.

Further, in order to avoid inviting the deterioration of characteristics by denaturing of the quantum dot layer 106 or the like, the film-forming process for forming the electron transport layer 107 and the negative electrode 108 is preferably carried out at a comparatively low temperature (for example, 200° C. or lower).

However, when the electron transport layer 107 is designed to have a large film thickness, film-forming or thermal treatment at a high temperature cannot be carried out when the film-forming process is carried out after forming the quantum dot layer 106, so that defects are liable to be generated in the film quality of the electron transport layer 107. For this reason, probability of recombination rises during the carrier transportation due to the aforementioned defects, thereby raising a fear of inviting decrease in the energy conversion efficiency.

Also, the interface junction between the electron transport layer 107 and the negative electrode 108 is preferably an ohmic contact and, for this purpose, there is a need to perform film-forming or thermal treatment at a high temperature of about 500° C. However, as described above, when a high temperature process is carried out, there is a fear of inviting deterioration of the characteristics of the quantum dot layer 106, thereby raising a fear that a sufficiency ohmic contact cannot be obtained.

Further, in the above-described conventional stack structure, after a pair of output electrodes 102 are formed on the surface of the transparent substrate 101, the positive electrode 103 is formed to cover the output electrodes 102. Therefore, the quantum dot arrangement layer 105 and the quantum dot layer 106 are formed in a state in which a step difference is generated in the underlying layer, as shown by D in the Figure. For this reason, it is difficult to form an extremely thin quantum dot arrangement layer 105 uniformly, thereby raising a fear that a desired highly precise periodical arrangement cannot be realized.

Therefore, in the present embodiment, a stack structure such as shown in FIG. 1 is adopted in order that a step difference may not be generated between the stacked films.

In other words, the negative electrode 2 is formed on the entire surface of the substrate 1, and the electron transport layer 3 is formed on the negative electrode 2, so that the electron transport layer 3 is formed before the quantum dot layer 5 is formed. Therefore, a thermal treatment at a high temperature can be easily carried out, and the junction interface between the negative electrode 2 and the electron transport layer 3 can be made to have a desired ohmic contact.

Also, even in a case in which the electron transport layer 3 having a large film thickness is formed, a high-temperature process can be carried out, so that the electron transport layer 3 having a good film quality with few defects can be obtained, whereby the energy conversion efficiency of the solar cell can be improved.

Also, even when the quantum dot arrangement layer 4 is formed, an extremely thin quantum dot arrangement layer 4 can be formed uniformly because the electron transport layer 3 serving as an underlying layer has a highly precise flatness. Therefore, the Si cluster particles will have a three-dimensional order of being periodically arranged at a high precision in a more orderly manner, so that the quantum dot layer 5 having a desired stack structure can be obtained.

Further, since the substrate 1 need not transmit solar light therethrough, the selectivity of the substrate 1 is also improved. Also, even when a glass substrate is selected as the substrate 1, there is no need to consider such light beam transmittance characteristics of the substrate, so that, from this viewpoint also, the selectivity of the substrate 1 is improved.

Also, since the solar cell is formed to allow solar light to be incident from the positive electrode 7 side, there is no need to consider the influence of oxidation at the interface even when the positive electrode 7 is formed of an oxide electroconductive film. Therefore, there will be less restriction in forming a contact to the output electrodes 8a, 8b, so that fabrication of the solar cell can be flexibly carried out.

In this manner, in the present embodiment, the negative electrode 2 is formed on the substrate 1, and the electron transport layer 3, the quantum dot arrangement layer 4, the quantum dot layer 5, the positive hole transport layer 6, and the positive electrode 7 are sequentially formed on a principal surface of the negative electrode 1; the output electrodes 8a, 8b are formed on the positive electrode 7 so that at least a part of the surface of the positive electrode 7 is exposed; the quantum dot layer 5 is constructed in such a manner that the quantum dots are formed of Si cluster particles; the Si cluster particles are three-dimensionally periodically arranged; the Si cluster particles have an average particle size of 3 nm or less; and an interparticle distance between the Si cluster particles is 1 nm or less. Therefore, the Si cluster particles have a core-shell structure made of a diamond structure and a cage structure, whereby a highly efficient solar cell having a high absorption coefficient, being inactive to chemical reactions, having a good carrier transport property, enabling extension of the lifetime of the carriers, and providing a good energy conversion efficiency can be realized.

Moreover, since the stack structure is a substrate 1/a negative electrode 2/an electron transport layer 3/a quantum dot arrangement layer 4/a quantum dot layer 5/a positive hole transport layer 6/a positive electrode 7/output electrodes 8a, 8b, a quantum dot layer 5 is not affected even when thermal treatment is carried out at a high temperature in forming the negative electrode 2 or the electron transport layer 3, so that the electron transport layer 3 having a good film quality with few defects can be obtained. Further, an ohmic contact can be ensured at the interface between the electron transport layer 3 and the negative electrode 2, so that a solar cell having a higher efficiency can be realized.

Also, since the quantum dot arrangement layer 4 made of a graphene-based material is disposed between the electron transport layer 3 and the quantum dot layer 5, it is possible to realize a highly precise periodical arrangement of Si cluster particles on the quantum dot arrangement layer 4.

Next, a method for producing the above-described solar cell will be described in detail.

FIGS. 5 and 6 are views of production steps showing one embodiment of a method for producing the present solar cell.

Figure 5A:
FIGS. 5(a) to 5(d) are views of production steps (1/2) illustrating one embodiment (first embodiment) of a method for producing a solar cell.

First, referring to FIG. 5(a), the substrate 1 having a plate thickness of 50 to 1000 μm is prepared, and the negative electrode 2 of Al—Nd or the like having a film thickness of 100 to 300 nm is formed in a whole region of the surface of the substrate 1 by using a thin film forming method such as the vacuum vapor deposition method or the sputtering method.

Figure 5B:
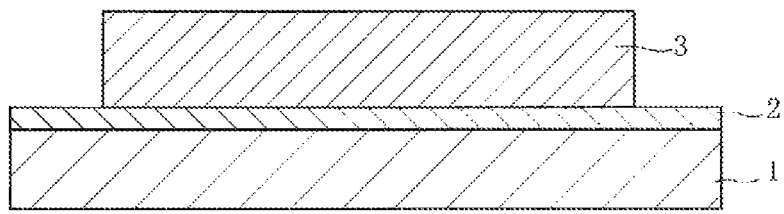

Subsequently, referring to FIG. 5(b), the electron transport layer 3 having a film thickness of 100 to 1000 nm is formed on the surface of the negative electrode 2 by using a thin film forming method such as the RF sputtering method. Here, during this time, the film-forming process is carried out for a predetermined period of time while setting the substrate temperature at the time of forming the film of the electron transport layer 3 to be 500 to 600° C. This allows that the junction interface has a good ohmic contact, and the film quality of the electron transport layer 3 will be a good one with restrained generation of defects.

Figure 5C:
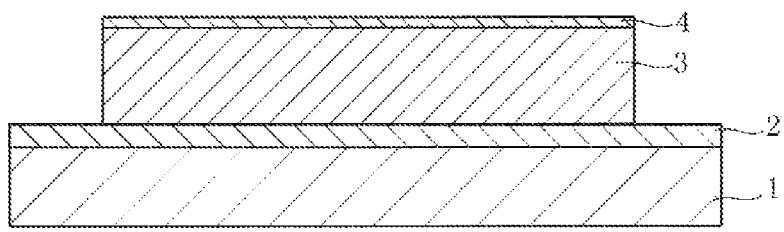

Subsequently, referring to FIG. 5(c), the quantum dot arrangement layer 4 is formed on the surface of the electron transport layer 3.

For example, in the case of forming the quantum dot arrangement layer 4 with graphene, first, a dispersion solution is fabricated in which graphene purified from graphite by the chemical peeling method or the like is dispersed into methanol or anhydrous propanol. Further, the graphene dispersion solution is dropwise added onto the surface of the substrate 1 on which the electron transport layer 3 has been formed in an Ar atmosphere, thereby to fabricate a graphene film having a film thickness of 0.15 to 1 nm.

Here, the concentration of the graphene dispersion solution is preferably adjusted so that a monolayer graphene film is formed after evaporation of the solvent of the dispersion liquid.

Figure 5D:
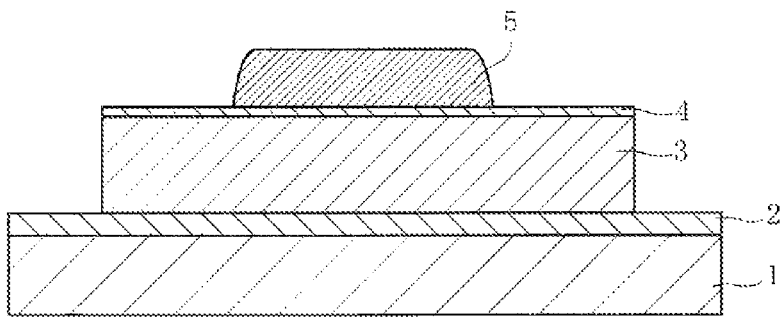

Subsequently, referring to FIG. 5(d), the quantum dot layer 5 made of an assembly of Si cluster particles is formed on the surface of the quantum dot arrangement layer 4.

Figure 7:
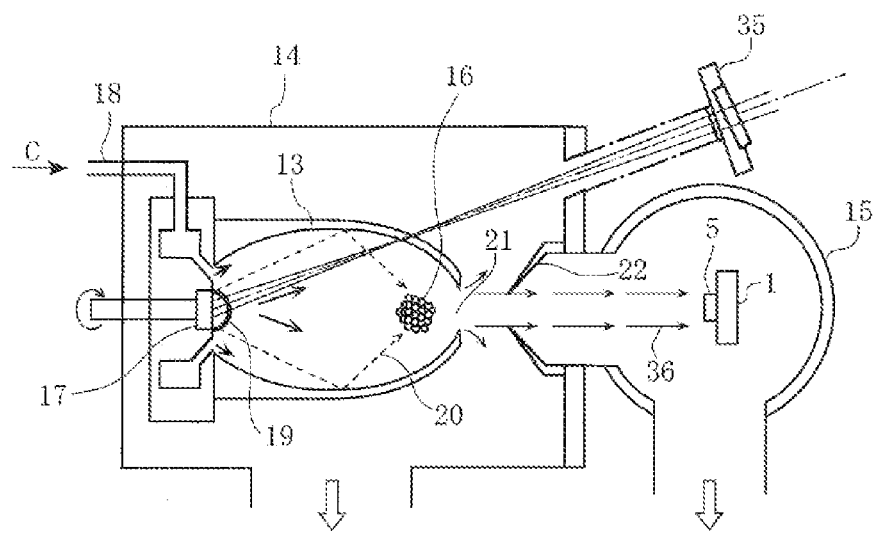
FIG. 7 is a schematic construction view of an Si cluster beam film-forming apparatus.

FIG. 7 is a schematic construction view of a Si cluster beam film-forming apparatus used for forming the quantum dot layer 5.

This Si cluster beam film-forming apparatus has cluster generating unit 14 provided with cluster generating cell 13 and vacuum tank 15 connected to the cluster generating unit 14. Further, the substrate 1 on which the electron transport layer 3 and the quantum dot arrangement layer 4 have been formed is put into vacuum tank 15, and Si cluster particles 16 generated in cluster generating unit 14 are vapor-deposited onto the substrate 1, whereby the quantum dot layer 5 is formed.

In other words, Si target 17 is set at an elliptic focal point of cluster generating cell 13 having an inner wall formed to have an elliptic shape, and an inert gas such as He is supplied to cluster generating cell 13 under a pressure of 1 to 10 Pa from inert gas inlet 18, as shown by arrow C. At the same time, laser light from Nd-YAG laser 35 set to have a wavelength of 532 nm, energy of 800 mJ, and a pulse width of 11 to 13 ns, for example, is radiated onto Si target 17.

Further, Si plume 19 generated by evaporation of Si target 17 becomes shock wave 20 in the inert gas in cluster generating cell 13 to be reflected by the inner wall; the Si vapor is confined in the inert gas for a short period of time of 100 μs to 300 μs; and Si cluster particles 16 are generated in a local boundary layer where the inert gas and the Si vapor are mixed. In other words, during this short period of time, cluster growth is generated in a local region where the inert gas and the Si vapor are in thermal equilibrium, and Si cluster particles 16 miniaturized to have an average particle size of 3 nm or less are generated. Generated Si cluster particles 16 are approximately neutral with few electric charge components and are ejected by being entrained by the inert gas from cell outlet 21 disposed to oppose to Si target 17, so as to be drawn out into the vacuum as Si cluster beam 36 via skimmer 22. Further, this Si cluster beam 36 flies and comes in the vacuum with a high kinetic energy and is vapor-deposited onto the quantum dot arrangement layer located on the substrate 1 disposed in vacuum tank 15, whereby the quantum dot layer 5 having a film thickness of 300 to 900 nm is formed. In other words, the above-described high kinetic energy is converted into an internal energy of Si cluster particles 16 at the time of collision to the substrate 1, so as to promote rearrangement among Si cluster particles 16 on the substrate 1, whereby a periodical arrangement in the quantum dot layer 5 is formed.

In the cluster beam film-forming apparatus described above, Si target 17 disposed in cluster generating cell 13 is irradiated with the laser light from Nd-YAG laser 35 so as to be evaporated; in the plane where the generated vapor and the inert gas are in contact, a mixture region of these vapor and inert gas is formed; and the shock wave generated in the aforesaid inert gas is made to collide in the aforesaid mixture region, whereby the mixture region is confined into a local space to generate Si cluster particles 16. Further, the inert gas is compressed by collision of shock wave 20 and transports the generated Si cluster at a high speed to vacuum tank 15. This allows that Si cluster particles 16 can be made to collide and vapor-deposited onto the substrate 1 at a high energy without being dissociated in vacuum, whereby desired quantum dot layer 5 can be formed.

Figure 6E:
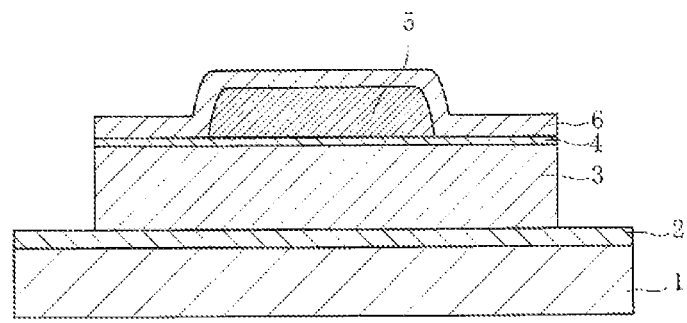
FIGS. 6(e) to 6(g) are views of production steps (2/2) illustrating one embodiment (first embodiment) of a method for producing a solar cell.

Next, referring to FIG. 6(e), the positive hole transport layer 6 is formed on the surface of the quantum dot layer 5. In other words, the positive hole transport layer 6 having a film thickness of 20 to 100 nm is formed on the surface of the quantum dot layer 5 at a treatment temperature of 200° C. or lower by using a thin film-forming method such as the vacuum vapor deposition method or the sputtering method.

Figure 6F:
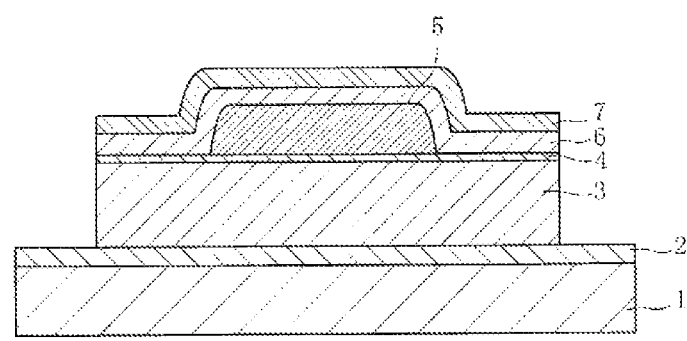

Subsequently, referring to FIG. 6(f), the positive electrode 7 made of a transparent electroconductive film having a film thickness of 50 to 200 nm is formed on the surface of the positive hole transport layer 6 similarly by controlling a treatment temperature to be 200° C. or lower.

Figure 6G:
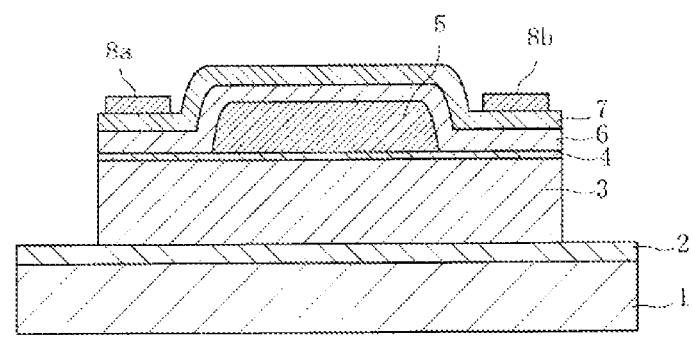

Lastly, referring to FIG. 6(g), a pair of output electrodes 8a, 8b having a film thickness of 200 to 2000 nm is formed on the surface of the positive electrode 7 similarly by controlling the substrate temperature to be 200° C. or lower.

In this manner, in the present embodiment, the negative electrode 2 is formed on the surface of the substrate 1 and thereafter the electron transport layer 3 is formed on a surface of the negative electrode 2; subsequently, the quantum dot arrangement layer 4 is formed on the surface of the electron transport layer 3; further, Si cluster particles having an average particle size of 3 nm or less are three-dimensionally periodically arranged on a principal surface of the aforesaid electron transport layer 3 so that an interparticle distance thereof is 1 nm or less, so as to form the aforesaid quantum dot layer 5; thereafter, the positive hole transport layer 6 is formed on the surface of the quantum dot layer 5; subsequently, the positive electrode 7 made of a light-transmitting material is formed on the surface of the positive hole transport layer 6; and further, the output electrodes 8a, 8b are formed on the positive electrode 7 so that at least a part of the surface of the positive electrode 7 is exposed. Therefore, a solar cell can be produced under desired film-forming conditions without giving consideration to the influence on the quantum dot layer 5, and also the substrate 1 need not have a light-transmitting property, so that the selectivity of the substrate 1 is also improved.

Moreover, since the quantum dot layer 5 is formed through one film-forming process so that the quantum dots are three-dimensionally periodically arranged, the production steps are simple in the case of stacking the Si cluster particles, thereby achieving an improvement in the productivity.

Figure 8:
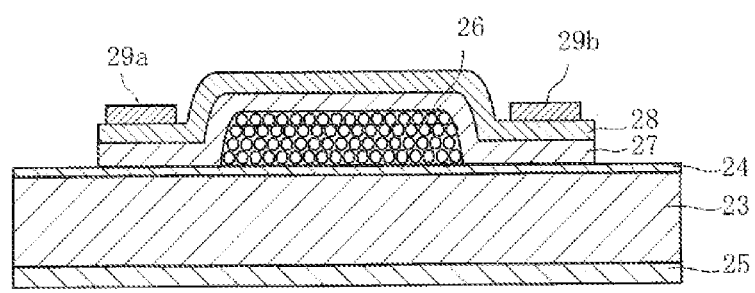
FIG. 8 is a cross-sectional view illustrating a second embodiment of a solar cell according to the present invention.

FIG. 8 is a cross-sectional view illustrating a second embodiment of a solar cell according to the present invention. In the present second embodiment, an electron transport layer 23 is formed of a single-crystal or polycrystal n-type Si-based substrate.

In other words, in this second embodiment, a quantum dot arrangement layer 24, a quantum dot layer 26, a positive hole transport layer 27, a positive electrode 28, and output electrodes 29a, 29b are formed on one principal surface of the electron transport layer 23 made of a single-crystal or polycrystal n-type Si-based substrate, and the negative electrode 25 is formed on the other principal surface of the aforesaid electron transport layer 23. This allows that the substrate 1 such as appears in the first embodiment can be omitted.

Figure 9A:
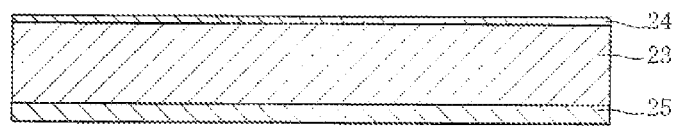
FIGS. 9(a) to 9(c) are views of production steps illustrating a second embodiment of a method for producing a solar cell.
Figure 9B:
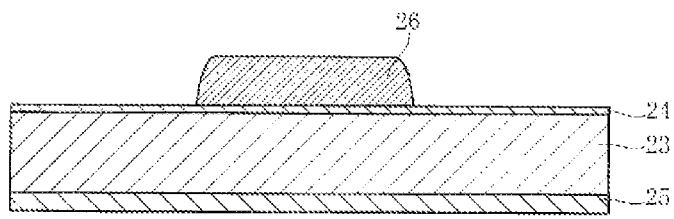
Figure 9C:
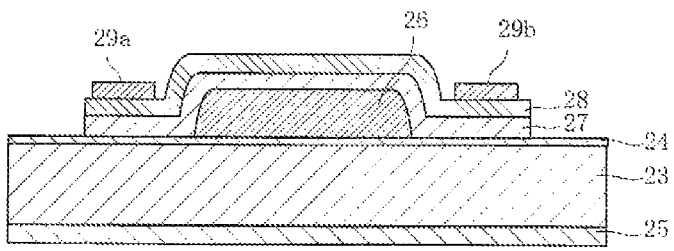

Further, a solar cell of this second embodiment can be produced as shown in FIGS. 9(a) to 9(c).

In other words, referring to FIG. 9(a), the quantum dot arrangement layer 24 is formed by a method similar to that of the first embodiment on one principal surface of the electron transport layer 23 made of a single-crystal or polycrystal n-type Si-based substrate, and the negative electrode 25 is formed on the other principal surface.

Subsequently, referring to FIG. 9(b), the quantum dot layer 26 is formed on the surface of the quantum dot arrangement layer 24 by a method similar to that of the first embodiment. Thereafter, referring to FIG. 9(c), the positive hole transport layer 27, the positive electrode 28, and the output electrode 29 can be formed on the surface of the quantum dot layer 26.

Figure 10:
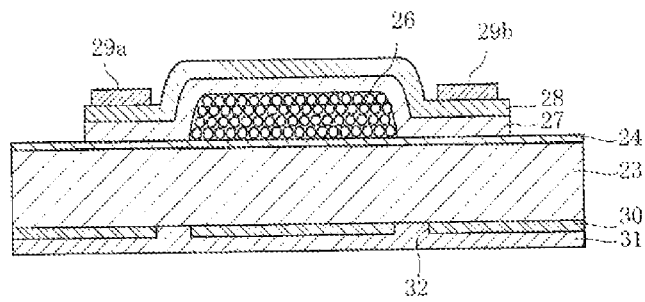
FIG. 10 is a cross-sectional view illustrating a modification of the second embodiment.

FIG. 10 is a modification of the second embodiment.

In other words, in this modification, an insulating film 30 having a predetermined pattern is formed with $SiO_2$ or the like on the other principal surface of the electron transport layer 23 formed of a single-crystal or polycrystal n-type Si-based substrate, and an negative electrode 31 is formed on the surface of the insulating film 30 so that a part thereof is joined to the electron transport layer 23. In other words, the negative electrode 31 is formed to have a contact hole 32 in between insulating films 30, whereby the negative electrode 31 and the electron transport layer 23 are connected via the aforesaid contact hole 32.

In this manner, by forming the insulating film 30 having a predetermined pattern on the other principal surface of the electron transport layer 23 and restricting the junction interface between the electron transport layer 23 and the negative electrode 31 to the contact hole 32 alone, part of the carriers transported via the electron transport layer 23 are captured by the surface defects and the like at the junction interface between the electron transport layer 23 and the insulating film 30. Further, insulating film 30 passivates the aforesaid surface defects and the like, whereby the probability of recombination can be reduced. This allows that a solar cell having a further better energy conversion efficiency can be obtained.

The quantum dot layer is not damaged during the film-forming process, and a solar cell having a good absorption coefficient, being excellent in carrier transport property, being capable of extending the lifetime of the carriers, and having a good energy conversion efficiency can be realized.

DESCRIPTION OF REFERENCE SYMBOLS

1 Substrate
2, 25 Negative electrode
3, 23 Electron transport layer
4, 24 Quantum dot arrangement layer
5, 26 Quantum dot layer
6, 27 Positive hole transport layer
7, 28 Positive electrode
8a, 8b, 29a, 29b Output electrode
11 Conduction band
12 Valence electron band

The invention claimed is:

1. A solar cell comprising:
a substrate;
a negative electrode on the substrate;
an electron transport layer, a quantum dot layer made of an assembly of quantum dots and constructed to absorb solar light, a positive hole transport layer, and a positive electrode made of a light-transmitting material sequentially arranged on a principal surface of the negative electrode; and
an output electrode on the positive electrode so that at least a part of a surface of the positive electrode is exposed, wherein
the quantum dot layer is constructed in such a manner that the quantum dots are three-dimensionally periodically arranged silicon cluster particles,
the silicon cluster particles have an average particle size of 3 nm or less, and an interparticle distance between the silicon cluster particles is 1 nm or less, and
the silicon cluster particles have a core-shell structure comprising a core part having an $sp^3$ hybrid orbital and a shell part having an $sp^2$ hybrid orbital.

2. The solar cell according to claim 1, wherein a quantum dot arrangement layer is located between the electron transport layer and the quantum dot layer,
the quantum dot arrangement layer is a graphene-based material,
the silicon cluster particles are periodically arranged on the quantum dot arrangement layer to form a first layer of the silicon cluster particles.

3. The solar cell according to claim 2, wherein Si atoms in the silicon cluster particles are adsorbed onto C atomic nuclei of the graphene-based material of the quantum dot arrangement layer.

4. The solar cell according to claim 1, wherein the substrate is a material selected from the group consisting of quartz glass, nonalkaline glass, borosilicate glass, alumina, gallium arsenic, silicon, and silicon carbide.

5. The solar cell according to claim 1, wherein the electron transport layer is an n-type silicon-based material.

6. The solar cell according to claim 1, wherein the quantum dot layer comprises a multiple energy level structure having an intermediate energy level between a valence electron band and a conduction band.

7. The solar cell according to claim 1, wherein the positive hole transport layer is a p-type silicon-based material.

8. The solar cell according to claim 1, wherein the negative electrode contains Al as a major component and further contains at least one kind of an impurity selected from Nd, Ta, and Cu, and a content of the impurity is 0.01 to 3 at %.

9. The solar cell according to claim 1, wherein the positive electrode is one of an oxide transparent electroconductive film, graphene, and a transparent electroconductive film made of a nanowire network texture.

10. The solar cell according to claim 1, wherein the quantum dot layer includes 100 to 300 stacked layers of the silicon cluster particles.

11. The solar cell according to claim 1, wherein the core part has a regular tetrahedron diamond structure and a surface layer of the shell part has a cage structure.

* * * * *